US010062557B2

(12) United States Patent
Kenny

(10) Patent No.: US 10,062,557 B2
(45) Date of Patent: Aug. 28, 2018

(54) MASS SPECTROMETER WITH INTERLEAVED ACQUISITION

(71) Applicant: Micromass UK Limited, Wilmslow (GB)

(72) Inventor: Daniel James Kenny, Knutsford (GB)

(73) Assignee: MICROMASS UK LIMITED, Wilmslow (GB)

( * ) Notice: Subject to any disclaimer, the term of this patent is extended or adjusted under 35 U.S.C. 154(b) by 17 days.

(21) Appl. No.: 15/305,684

(22) PCT Filed: Apr. 24, 2015

(86) PCT No.: PCT/GB2015/051210
§ 371 (c)(1),
(2) Date: Oct. 21, 2016

(87) PCT Pub. No.: WO2015/162435
PCT Pub. Date: Oct. 29, 2015

(65) Prior Publication Data

US 2017/0047212 A1 Feb. 16, 2017

(30) Foreign Application Priority Data

Apr. 24, 2014 (EP) .................................... 14165775
Apr. 24, 2014 (GB) .................................. 1407201.1

(51) Int. Cl.
*H01L 49/00* (2006.01)
*H01J 49/00* (2006.01)
*H01J 49/42* (2006.01)

(52) U.S. Cl.
CPC ........ *H01J 49/0081* (2013.01); *H01J 49/004* (2013.01); *H01J 49/0031* (2013.01); *H01J 49/0045* (2013.01); *H01J 49/4215* (2013.01)

(58) Field of Classification Search
None
See application file for complete search history.

(56) References Cited

U.S. PATENT DOCUMENTS 7,638,762 B2 * 12/2009 Russ, IV ............... H01J 49/004 250/281
8,084,733 B2 * 12/2011 Russ, IV ............... H01J 49/004 250/281

(Continued)

FOREIGN PATENT DOCUMENTS

WO WO 2012143728 A1 * 10/2012 .......... H01J 49/0031

*Primary Examiner* — Andrew Smyth
(74) *Attorney, Agent, or Firm* — Womble Bond Dickinson (US) LLP; Deborah M. Vernon; Heath T. Misley

(57) ABSTRACT

A method of mass spectrometry is disclosed comprising passing ions through a first stage and a second stage of a mass spectrometer and monitoring a first ion acquisition for a first dwell time extending from a time $T_1$ to a time $T_1+T_{dwell1}$. The method further comprises reconfiguring the mass spectrometer or one or more components of the mass spectrometer to monitor a second ion acquisition and setting the first stage to transmit ions of the second ion acquisition at a time T, wherein $T<T_1+T_{dwell1}$. The method further comprises monitoring the second ion acquisition for a second dwell time starting at a time $T_2$, wherein $T_2>T_1+T_{dwell1}$ and determining the time T based on a known or calculated ion transit time through one or more regions or components of the mass spectrometer disposed downstream of the first stage.

19 Claims, 2 Drawing Sheets

(56) References Cited

U.S. PATENT DOCUMENTS

| | | | | |
|---|---|---|---|---|
| 8,368,010 | B2 * | 2/2013 | Kawana .............. | H01J 49/4215 250/281 |
| 8,384,028 | B2 * | 2/2013 | Fujita .................. | H01J 49/0045 250/281 |
| 8,410,436 | B2 * | 4/2013 | Mukaibatake ........ | H01J 49/429 250/288 |
| 8,440,963 | B2 * | 5/2013 | Belov ................... | H01J 49/004 250/281 |
| 8,674,299 | B2 * | 3/2014 | Hirabayashi .......... | H01J 49/004 250/281 |
| 8,692,191 | B2 * | 4/2014 | Kou .................... | H01J 49/0031 250/281 |
| 8,829,434 | B2 * | 9/2014 | Yasuda ............... | H01J 49/0045 250/281 |
| 8,859,955 | B2 * | 10/2014 | Green ................. | H01J 49/0031 250/281 |
| 9,147,563 | B2 * | 9/2015 | Makarov ............. | H01J 49/0045 |
| 2009/0057553 | A1 * | 3/2009 | Goodenowe ........ | H01J 49/0031 250/292 |
| 2011/0006203 | A1 * | 1/2011 | Fujita .................. | H01J 49/0045 250/288 |
| 2011/0248160 | A1 * | 10/2011 | Belov ................. | H01J 49/0031 250/283 |
| 2011/0315868 | A1 * | 12/2011 | Hirabayashi .......... | H01J 49/004 250/282 |
| 2012/0160998 | A1 * | 6/2012 | Kou .................... | H01J 49/0031 250/286 |

* cited by examiner

MASS SPECTROMETER WITH INTERLEAVED ACQUISITION

CROSS-REFERENCE TO RELATED APPLICATIONS

This application represents the U.S. National Phase of International Application No. PCT/GB2015/051210 entitled "Mass Spectrometer with Interleaved Acquisition" filed 24 Apr. 2015, which claims priority from and the benefit of United Kingdom patent application No. 1407201.1 filed on 24 Apr. 2014 and European patent application No. 14165775.9 filed on 24 Apr. 2014. The entire contents of these applications are incorporated herein by reference.

FIELD OF THE PRESENT INVENTION

The present invention relates generally to mass spectrometry and in particular to methods of mass spectrometry and mass spectrometers.

BACKGROUND

Multi-stage or tandem mass spectrometry involves two or more stages of mass selection, separation and/or analysis, typically with ions being fragmented between these stages. For instance, a tandem quadrupole mass spectrometer generally consists of a first resolving quadrupole mass filter, followed by a collision cell, followed a second resolving quadrupole mass filter and an ion detector.

Selective Ion Monitoring ("SRM") is a known tandem quadrupole mass spectrometry technique wherein the first quadrupole mass filter is initially set to only transmit parent or precursor ions having a single specific mass to charge ratio ("m/z"). These parent or precursor ions are then fragmented in the collision cell and the resulting fragment ions are directed towards the second resolving quadrupole mass filter which is set to transmit only fragment ions having a specific mass to charge ratio towards the ion detector. Each SRM transition thus comprises a precursor-fragment ion pair. Multiple Reaction Monitoring ("MRM") typically involves measuring multiple different precursor-fragment ion transitions.

The length of time that the ion current for a single acquisition (e.g. a particular MRM transition) is measured is known as the "dwell time". The time between adjacent dwell times is known as the "interscan" or "interchannel" time. The "cycle time" is the sum of all of the dwell times and interscan times constituting the cycle.

In a MRM experiment, once a first transition has been measured, the instrument must then be reconfigured in order to measure a second different transition. It is also necessary to ensure that, following any reconfiguration, the ion current of the second transition is sufficiently stabilised to allow an accurate measurement to be made. This must be done before the second transition is measured and so these factors determine the length of the interscan time.

Known approaches for reducing the interscan time involve controlling the interscan time or the order at which transitions are measured based on the mass difference or difference in parameters between adjacent scans. However, these approaches are inherently of a serial nature. These techniques are fundamentally limited as the interscan time cannot be reduced below the transit time of ions through the mass spectrometer.

U.S. Pat. No. 7,638,762 (Russ) discloses a method of optimising the performance of a mass spectrometer when multiple measurements are made.

U.S. Pat. No. 8,410,436 (Mukaibatake) discloses a quadrupole mass spectrometer wherein a relatively short settling time is set.

U.S. Pat. No. 8,368,010 (Kawana) discloses a quadrupole mass spectrometer which is capable of reducing a settling time-period.

U.S. Pat. No. 8,084,733 (Russ) discloses a method for optimising the performance of a mass spectrometer.

US 2011/0006203 (Fujita) discloses a method of removing ions from a collision cell during a halt period when the introduction of ions is temporally discontinued to change the objective ion being monitored. Introduction of the second group of ions to the collision cell is only initiated after the introduction of a first group is discontinued.

US 2011/0248160 (Belov), US 2009/0057553 (Goodenowe), US 2012/0160998 (Kou) and US 2011/0315868 (Hirabayashi) disclose various methods utilizing ion traps or pulsed ion injection.

In Belav, a pulsed multiple reaction monitoring process is disclosed where the acquisition in the Q3 quadrupole is changed in synchronisation with the release of ions from an upstream ion trap. The ions for the second reaction are therefore only transmitted after Q3 is reconfigured.

WO 2013/092923 (Makarov) discloses a mass spectrometer containing parallel collision cells to which precursor ions may sequentially be directed.

WO 2012/143728 (Green) discloses a method of fast switching. The instrument is intentionally not allowed to equilibrate after switching so no interscan time can be defined.

EP-2642509 (Hitachi) discloses a method of adjusting an accelerating voltage applied across a collision chamber based on mass to charge ratio so that all fragment ions have the same velocity.

Several of the known arrangements require relatively complicated instrument geometries or control systems.

It is desired to reduce the interscan time between successive MRM transitions.

SUMMARY OF THE PRESENT INVENTION

According to an aspect there is provided a method of mass spectrometry comprising:

passing ions through a first stage to a second stage of a mass spectrometer;

monitoring a first ion acquisition for a first dwell time extending from a time $T_1$ to a time $T_1+T_{dwell1}$;

reconfiguring the mass spectrometer or one or more components of the mass spectrometer to monitor a second ion acquisition;

setting the first stage to transmit ions of the second ion acquisition at a time T, wherein $T<T_1+T_{dwell1}$; and monitoring the second ion acquisition for a second dwell time starting at a time $T_2$, wherein $T_2>T_1+T_{dwell1}$;

the method further comprising determining the time T based on a known or calculated ion transit time through one or more regions or components of said mass spectrometer disposed downstream of the first stage.

It has been recognised that the interscan time within a tandem or multi-stage mass spectrometer may be reduced by exploiting the ion current instantaneously stored within the components of the mass spectrometer between the first stage and the second stage and/or an ion detector. Ions take a certain amount of time to transit these components and this allows the instrument to be reconfigured to start simultaneously transmitting ions for the second acquisition without affecting the previous measurement.

The transit time of ions through a particular region or component represents an instantaneous stored ion current that may subsequently be passed to the second stage or to a detector for monitoring. It has been recognised that any components (e.g. the first stage) of the mass spectrometer may be reconfigured without affecting the subsequent transmission/measurement of any downstream ion current. That is, as soon as ion current exits a particular component, that component, and any upstream components, may be reconfigured without affecting the measurement of any of the downstream ion current.

The time T at which the first stage is arranged to start transmitting ions for the second ion acquisition will in part determine the interscan time. The method may therefore further comprise determining the time T so as to reduce an interscan time. The interscan time is generally the "dead" time between monitoring the first and second ion acquisitions, i.e. the time between the start of the second dwell time and the end of the first dwell time: $T_2-(T_1+T_{dwell1})$. The techniques described herein allow this to be reduced compared to conventional arrangements. This is achieved by setting the first stage of a tandem or multi-stage mass spectrometer to transmit the ions of the second acquisition during the first dwell period.

Reducing the interscan time between successive acquisitions is advantageous as it allows a reduction in the overall cycle time so that more acquisitions can be monitored in a given amount of time.

Alternatively, it allows the dwell time to be increased whilst maintaining a constant cycle time. Increasing the dwell time allows the ion current to be measured for longer so that a more sensitive and/or accurate measurement can be made.

It will be appreciated that the techniques described herein allow successive acquisitions to be temporally interleaved. This may be achieved without requiring a relatively complex geometry e.g. containing physically parallel devices or ion paths. For instance, by exploiting the ion current stored in the various components at any moment in time the techniques described herein allow interleaved or effectively parallel acquisitions to be acquired using linear instrument geometries.

The ions may be passed through the first stage and/or are passed through the one or more components or regions and/or passed to the second stage as a substantially continuous, pseudo-continuous or extended stream.

The second stage is generally disposed downstream of the first stage so that ions pass sequentially from the first stage to the second stage through the one or more components or regions. That is, the same ions may be passed through the same first and second stages as part of an extended or continuous stream. The continuous or pseudo-continuous ion beam may be monitored directly, i.e. continuously e.g. using a quadrupole analyser or may be sampled discretely e.g. using a TOF or trap mass analyser. The one or more components may comprise one or more ion guides or collision or reaction cells.

The ions may be passed to the first stage as a continuous stream or a (pseudo-) continuous ion beam may be generated in the first stage e.g. due to an ion mobility separation. The temporal length of the ion beam or stream may generally be longer than the transit time through any intermediate component. It will be appreciated that MRM is generally a continuous beam technique. This is in contradistinction to pulsed or trap-and-release modes of operation. With a pulsed ion beam there will generally be no instantaneous stored ion current within any intermediate components, as the ions are passed as discrete packets.

It will be understood that a first ion acquisition corresponds to monitoring some of the ions being passed through the first stage to the second stage of the mass spectrometer under a first set of operating conditions. Setting the first stage to transmit ions of the second ion acquisition thus involves changing one or more operating conditions of the mass spectrometer. Generally, the first and second ion acquisition are monitored using the same first and second stages i.e. ions are sequentially passed from the first stage to the second stage.

For example, in a tandem quadrupole, a first ion acquisition may correspond to a first MRM transition and a second ion acquisition to a second different MRM transition. The mass spectrometer may be reconfigured to monitor different ion acquisitions. The reconfiguration may involve changing one or more operating parameters of the mass spectrometer or of one or more components of the mass spectrometer. A second ion acquisition is therefore one acquired under a second set of operating conditions. The mass spectrometer is reconfigured and the ion current for the second ion acquisition stabilised, within the time period $T_1$ to $T_2$ so that the second ion acquisition can be monitored at $T_2$.

It is noted that multiple reconfigurations may be made during a particular experimental cycle. Operating parameters may generally be changed independently of one another and at different times. The first and second ion acquisitions are not necessarily adjacent acquisitions. That is, multiple first acquisitions can be monitored after an operating parameter is changed. This may be the case when the reconfiguration is of a component disposed significantly upstream of the ion detector, for example, changing the polarity of the ion source. In this case, there may be sufficient ion current in the components of the mass spectrometer between the ion source and the ion detector to allow multiple first ion acquisitions to be monitored before monitoring the second ion acquisition.

The time T at which ions of the second acquisition are transmitted through the first stage is determined generally based on the ion transit time through the intermediate components or regions of the mass spectrometer. For instance, the time T may be based on the ion transit time through an ion guide and/or collision cell. The ion guide and/or collision cell may generally be disposed intermediate between the first stage and the second stage or a detector.

The time T may be chosen so that the time difference between the end of the first dwell period, $T_1+T_{dwell1}$, and the time at which the first stage is set to transmit ions of the second acquisition, T, substantially corresponds to the transit time of ions through a component of the mass spectrometer. In this way, the mass spectrometer can be reconfigured for an additional time $(T_1+T_{dwell1})-T$ without interfering with the previous acquisition. This may allow a corresponding reduction in interscan time of up to $(T_1+T_{dwell1})-T$. To avoid cross talk, the time T may be based on the ion transit time such that the time difference is slightly lower than the actual ion transit time to account for diffusion between ions from adjacent acquisitions.

The time T may be chosen based only indirectly on the ion transit time. That is, the time difference $(T_1+T_{dwell1})-T$ need not correlate directly with the transit time of ions through any or all of the components. It will be appreciated that the ion transit time(s) through the one or more components represents the maximum possible reduction in interscan time. However, the time T may be fixed or derived from a look-up table and a reduction in interscan time will still be achieved provided that the time T is selected such that ions for the second acqusition start to be transmitted during the course of the first ion acqusition in order to take advantage of stored ion current relating to the first ion acqusition.

The one or more regions or components of the mass spectrometer may be disposed upstream the second stage or the ion detector.

For instance, the one or more regions or components may be disposed between the first and second stages.

In embodiments, the second stage comprises an ion detector or is arranged to transmit ions to an ion detector. The ion detector monitors the ion acquisitions. For example, the ion detector may measure the ion current.

The first stage and/or second stage may be independently selected from the group comprising: (i) a quadrupole mass filter or analyser; (ii) an ion mobility separation or differential ion mobility separation device; (iii) a Time of Flight mass analyser or other mass analyser; (iv) an ion trap; and (v) an ion guide or ion transfer device.

Particularly, the first and second stages may both be quadrupole mass filters. However, it also contemplated that the first stage may be a quadrupole mass filter and the second stage may be a Time of Flight mass analyser. It will be appreciated that the techniques described herein may apply generally to any tandem mass spectrometer in which acquisitions may be temporally interleaved.

In embodiments, the mass spectrometer comprises a fragmentation or reaction device disposed between the first and second stages so that the first stage transmits parent or precursor ions and the second stage transmits fragment, daughter or product ions.

The fragmentation or reaction device may be a collision or reaction cell or device.

In an embodiment, the mass spectrometer is a tandem mass spectrometer comprising a first quadrupole mass filter or mass analyser and a second quadrupole mass filter or mass analyser operated to monitor first and second MRM transitions.

In embodiments, the fragmentation or reaction device is cleared of ions between the first and second acquisitions. The fragmentation or reaction device may be cleared using an AC or DC driving force, travelling wave or axial field.

The travelling wave optionally comprises applying one or more transient DC voltages or potentials or one or more transient DC voltage or potential waveforms to a plurality of electrodes. The transient DC voltages or potentials optionally create real potential barriers which are progressively translated along the length of the fragmentation or reaction device.

This allows "cross-talk" between the first and second acquisitions to be reduced or eliminated.

Reconfiguring the mass spectrometer may comprise change one or more of: (i) the mass to charge ratio of ions transmitted through a quadrupole mass filter or analyser; (ii) a collision energy or other fragmentation or reaction parameter; (iii) the polarity of the instrument; (iv) an RF voltage applied to an ion guide; (v) a DC axial field or voltage applied to a component of the mass spectrometer; or (vi) a de-clustering or cone voltage.

For instance, by changing the DC and AC voltages applied to a quadrupole device, ions of different mass to charge ratio will be transmitted. First and second different MRM transitions can thus be monitored by changing the DC and AC resolving voltages applied to the first and/or second quadrupole mass filters.

In certain situations, state of the art instruments can now reach interscan times between successive MRM acquisitions as low as 1.0 millisecond. However, in other situations, such as when switching the polarity of the ion source, the interscan times can be as long as 5-20 ms.

In prior art instruments the interscan time is physically limited by the transit time of ions through the instrument.

The techniques described herein enable a further reduction in interscan time. For example the interscan time between successive MRM acquisitions can be reduced below 1 ms.

In embodiments, the interscan time is less than about 0.2 ms, about 0.3 ms, about 0.4 ms, about 0.5 ms, about 0.6 ms, about 0.8 ms, about 1.0 ms, about 2.0 ms, about 3.0 ms, about 4.0 ms, about 5.0 ms, about 10 ms or about 20 ms.

According to another aspect there is provided a mass spectrometer comprising:

a first stage;

a second stage; and a control system arranged and adapted:

(i) to monitor a first ion acquisition for a first dwell time extending from a time $T_1$ to a time $T_1+T_{dwell1}$;

(ii) to reconfigure the mass spectrometer or one or more components of the mass spectrometer to monitor a second ion acquisition;

(iii) to set the first stage to transmit ions of the second ion acquisition at a time T, wherein $T<T_1+T_{dwell1}$; and (iv) to monitor a second ion acquisition for a second dwell time starting at a time $T_2$, wherein $T_2>T_1+T_{dwell1}$.

The control system and/or a processor may be arranged and adapted to determine the time T based on a known or calculated ion transit time through one or more regions or components of the mass spectrometer downstream of the first stage and/or between the first and second stages.

According to another aspect there is provided a method of mass spectrometry comprising:

passing a beam of ions through a tandem mass spectrometer comprising a collision cell, a first quadrupole mass filter or analyser disposed upstream of the collision cell arranged to transmit parent or precursor ions, and a second quadrupole mass analyser disposed downstream of the collision cell arranged to transmit fragment or product ions;

monitoring a first precursor-fragment transition for a first dwell time extending from a time $T_1$ to a time $T_1+T_{dwell1}$;

setting the first quadrupole mass analyser to transmit parent or precursor ions of the second transition at a time T, wherein $T<T_1+T_{dwell1}$; and monitoring a second precursor-fragment transition for a second dwell time starting at a time $T_2$, wherein $T_2>T_1+T_{dwell1}$, the method further comprising determining said time T based on a known or calculated ion transit time through the collision cell and/or through an ion guide disposed upstream of the second quadrupole mass filter or analyser.

In embodiments, the interscan time is less than about 0.2 ms, about 0.3 ms, about 0.4 ms, about 0.5 ms, about 0.6 ms, about 0.8 ms, about 1.0 ms, about 2.0 ms, about 3.0 ms, about 4.0 ms, about 5.0 ms, about 10 ms or about 20 ms. Advantageously, the interscan time can be reduced below about 1 ms.

In embodiments, fragment ions are transmitted from the second quadrupole mass filter or analyser to an ion detector.

According to another aspect there is provided a tandem mass spectrometer comprising:

a first quadrupole mass filter or analyser;

a second quadrupole mass filter or analyser;

a collision cell disposed between the first and second quadrupole mass filters or analysers; and a control system arranged and adapted:

(i) to monitor a first precursor-fragment transition for a first dwell time extending from a time $T_1$ to a time $T_1+T_{dwell1}$;

(ii) to set the first quadrupole mass filter or analyser to transmit parent or precursor ions of the second transition at a time T, wherein $T<T_1+T_{dwell1}$, and (iii) to monitor a second precursor-fragment transition for a second dwell time starting at a time $T_2$, wherein $T_2>T_1+T_{dwell1}$.

In yet another aspect there is provided a method of mass spectrometry comprising:

providing a mass spectrometer comprising a first stage and a second stage;

monitoring a first ion acquisition for a first dwell time extending from a time $T_1$ to a time $T_1+T_{dwell1}$;

reconfiguring the mass spectrometer or one or more components of the mass spectrometer to monitor a second ion acquisition;

setting the first stage to transmit ions of the second ion acquisition at a time T, wherein $T<T_1+T_{dwell1}$; and monitoring a second ion acquisition for a second dwell time starting at a time $T_2$, wherein $T_2>T_1+T_{dwell1}$.

The method of this aspect may be combined with any or all of the features described above in relation to any of the previous aspects to the extent that they are not mutually incompatible.

According to an embodiment the mass spectrometer may further comprise:

(a) an ion source selected from the group consisting of: (i) an Electrospray ionisation ("ESI") ion source; (ii) an Atmospheric Pressure Photo Ionisation ("APP") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray Ionisation ("LSI") ion source; (xxiv) a Sonicspray Ionisation ("SSI") ion source; (xxv) a Matrix Assisted Inlet Ionisation ("MAII") ion source; (xxvi) a Solvent Assisted Inlet Ionisation ("SAII") ion source; (xxvii) a Desorption Electrospray Ionisation ("DESI") ion source; and (xxviii) a Laser Ablation Electrospray Ionisation ("LAESI") ion source; and/or (b) one or more continuous or pulsed ion sources; and/or (c) one or more ion guides; and/or (d) one or more ion mobility separation devices and/or one or more Field Asymmetric Ion Mobility Spectrometer devices; and/or (e) one or more ion traps or one or more ion trapping regions; and/or (f) one or more collision, fragmentation or reaction cells selected from the group consisting of: (i) a Collisional Induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("PID") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device; (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions; (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic mass analyser arranged to generate an electrostatic field having a quadro-logarithmic potential distribution; (x) a Fourier Transform electrostatic mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter; and/or (k) a device or ion gate for pulsing ions; and/or (I) a device for converting a substantially continuous ion beam into a pulsed ion beam.

The mass spectrometer may further comprise either:

(i) a C-trap and a mass analyser comprising an outer barrel-like electrode and a coaxial inner spindle-like electrode that form an electrostatic field with a quadro-logarithmic potential distribution, wherein in a first mode of operation ions are transmitted to the C-trap and are then injected into the mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

According to an embodiment the mass spectrometer further comprises a device arranged and adapted to supply an AC or RF voltage to the electrodes. The AC or RF voltage preferably has an amplitude selected from the group consisting of: (i) about <50 V peak to peak; (ii) about 50-100 V peak to peak; (iii) about 100-150 V peak to peak; (iv) about 150-200 V peak to peak; (v) about 200-250 V peak to peak; (vi) about 250-300 V peak to peak; (vii) about 300-350 V peak to peak; (viii) about 350-400 V peak to peak; (ix) about 400-450 V peak to peak; (x) about 450-500 V peak to peak; and (xi) >about 500 V peak to peak.

The AC or RF voltage may have a frequency selected from the group consisting of: (i) <about 100 kHz; (ii) about 100-200 kHz; (iii) about 200-300 kHz; (iv) about 300-400 kHz; (v) about 400-500 kHz; (vi) about 0.5-1.0 MHz; (vii) about 1.0-1.5 MHz; (viii) about 1.5-2.0 MHz; (ix) about 2.0-2.5 MHz; (x) about 2.5-3.0 MHz; (xi) about 3.0-3.5 MHz; (xii) about 3.5-4.0 MHz; (xiii) about 4.0-4.5 MHz; (xiv) about 4.5-5.0 MHz; (xv) about 5.0-5.5 MHz; (xvi) about 5.5-6.0 MHz; (xvii) about 6.0-6.5 MHz; (xviii) about 6.5-7.0 MHz; (xix) about 7.0-7.5 MHz; (xx) about 7.5-8.0 MHz; (xxi) about 8.0-8.5 MHz; (xxii) about 8.5-9.0 MHz; (xxiii) about 9.0-9.5 MHz; (xxiv) about 9.5-10.0 MHz; and (xxv) >about 10.0 MHz.

The mass spectrometer may also comprise a chromatography or other separation device upstream of an ion source. According to an embodiment the chromatography separation device comprises a liquid chromatography or gas chromatography device. According to another embodiment the separation device may comprise: (i) a Capillary Electrophoresis ("CE") separation device; (ii) a Capillary Electrochromatography ("CEC") separation device; (iii) a substantially rigid ceramic-based multilayer microfluidic substrate ("ceramic tile") separation device; or (iv) a supercritical fluid chromatography separation device.

The ion guide may be maintained at a pressure selected from the group consisting of: (i) <about 0.0001 mbar; (ii) about 0.0001-0.001 mbar; (iii) about 0.001-0.01 mbar; (iv) about 0.01-0.1 mbar; (v) about 0.1-1 mbar; (vi) about 1-10 mbar; (vii) about 10-100 mbar; (viii) about 100-1000 mbar; and (ix) >about 1000 mbar.

According to an embodiment analyte ions may be subjected to Electron Transfer Dissociation ("ETD") fragmentation in an Electron Transfer Dissociation fragmentation device. Analyte ions may be caused to interact with ETD reagent ions within an ion guide or fragmentation device.

According to an embodiment in order to effect Electron Transfer Dissociation either: (a) analyte ions are fragmented or are induced to dissociate and form product or fragment ions upon interacting with reagent ions; and/or (b) electrons are transferred from one or more reagent anions or negatively charged ions to one or more multiply charged analyte cations or positively charged ions whereupon at least some of the multiply charged analyte cations or positively charged ions are induced to dissociate and form product or fragment ions; and/or (c) analyte ions are fragmented or are induced to dissociate and form product or fragment ions upon interacting with neutral reagent gas molecules or atoms or a non-ionic reagent gas; and/or (d) electrons are transferred from one or more neutral, non-ionic or uncharged basic gases or vapours to one or more multiply charged analyte cations or positively charged ions whereupon at least some of the multiply charged analyte cations or positively charged ions are induced to dissociate and form product or fragment ions; and/or (e) electrons are transferred from one or more neutral, non-ionic or uncharged superbase reagent gases or vapours to one or more multiply charged analyte cations or positively charged ions whereupon at least some of the multiply charge analyte cations or positively charged ions are induced to dissociate and form product or fragment ions; and/or (f) electrons are transferred from one or more neutral, non-ionic or uncharged alkali metal gases or vapours to one or more multiply charged analyte cations or positively charged ions whereupon at least some of the multiply charged analyte cations or positively charged ions are induced to dissociate and form product or fragment ions; and/or (g) electrons are transferred from one or more neutral, non-ionic or uncharged gases, vapours or atoms to one or more multiply charged analyte cations or positively charged ions whereupon at least some of the multiply charged analyte cations or positively charged ions are induced to dissociate and form product or fragment ions, wherein the one or more neutral, non-ionic or uncharged gases, vapours or atoms are selected from the group consisting of: (i) sodium vapour or atoms; (ii) lithium vapour or atoms; (iii) potassium vapour or atoms; (iv) rubidium vapour or atoms; (v) caesium vapour or atoms; (vi) francium vapour or atoms; (vii) $C_{60}$ vapour or atoms; and (viii) magnesium vapour or atoms.

The multiply charged analyte cations or positively charged ions may comprise peptides, polypeptides, proteins or biomolecules.

According to an embodiment in order to effect Electron Transfer Dissociation: (a) the reagent anions or negatively charged ions are derived from a polyaromatic hydrocarbon or a substituted polyaromatic hydrocarbon; and/or (b) the reagent anions or negatively charged ions are derived from the group consisting of: (i) anthracene; (ii) 9,10 diphenyl-anthracene; (iii) naphthalene; (iv) fluorine; (v) phenanthrene; (vi) pyrene; (vii) fluoranthene; (viii) chrysene; (ix) triphenylene; (x) perylene; (xi) acridine; (xii) 2,2' dipyridyl; (xiii) 2,2' biquinoline; (xiv) 9-anthracenecarbonitrile; (xv) dibenzothiophene; (xvi) 1,10'-phenanthroline; (xvii) 9' anthracenecarbonitrile; and (xviii) anthraquinone; and/or (c) the reagent ions or negatively charged ions comprise azobenzene anions or azobenzene radical anions.

According to an embodiment the process of Electron Transfer Dissociation fragmentation comprises interacting analyte ions with reagent ions, wherein the reagent ions comprise dicyanobenzene, 4-nitrotoluene or azulene.

BRIEF DESCRIPTION OF THE DRAWINGS

Various embodiments together with other arrangements given for illustrative purposes only will now be described, by way of example only, and with reference to the accompanying drawings in which.

DETAILED DESCRIPTION

A conventional MRM method will first be described.

In tandem or multi-stage mass spectrometry, an ion acquisition is monitored for a certain dwell time. In order to monitor a different ion acquisition it is generally necessary to reconfigure the instrument. For example, the mass to charge ratio of ions transmitted by one or more quadrupole mass filters may be changed. Other reconfigurations include changing the polarity of the instrument, changing a collision energy, changing the RF voltages applied to an ion guide, changing a DC axial field or voltage and changing a declustering or cone voltage. These reconfigurations generally have an associated settling or stabilisation time. To measure the second acquisition with sufficient accuracy, the mass spectrometer should be reconfigured and the ion beam should be allowed to stabilise before the start of the second dwell time.

Figure 1:
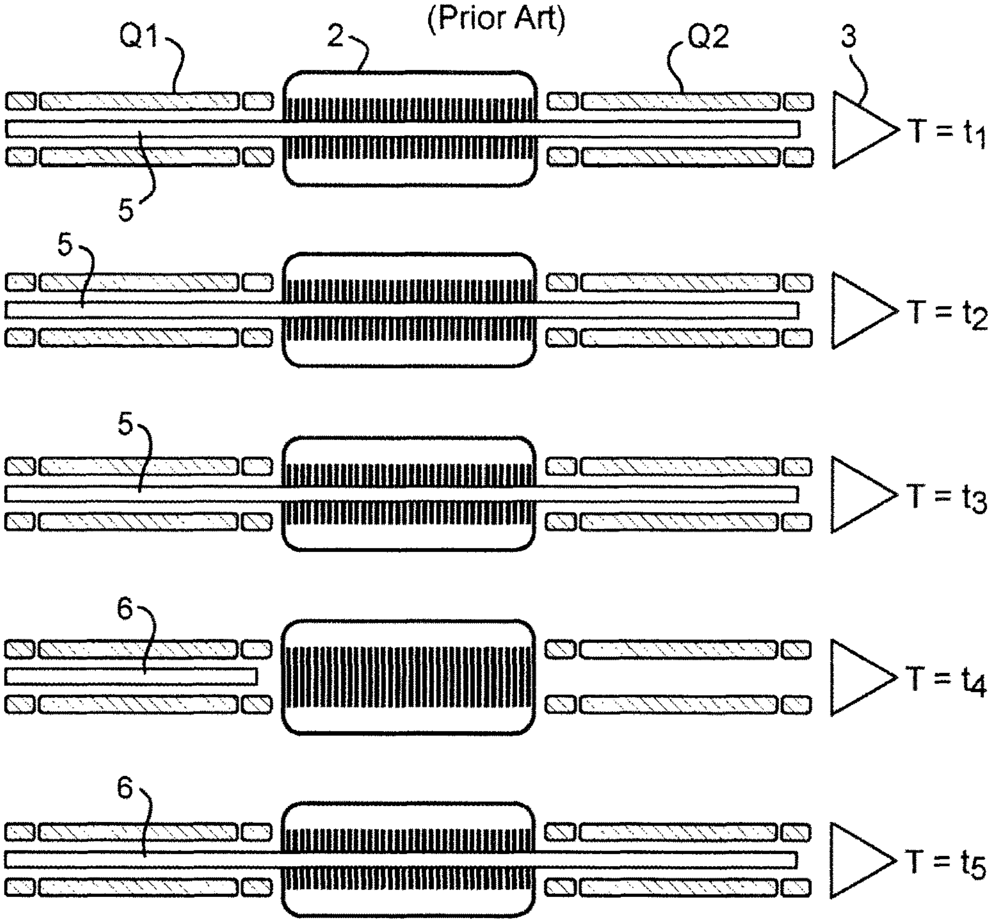
Fig. 1 (Prior Art)
FIG. 1 illustrates a conventional MRM acquisition method.

FIG. 1 shows a conventional tandem quadrupole mass spectrometer comprising a first resolving quadrupole mass filter Q1, a collision cell 2 for fragmenting ions transmitted by the first quadrupole mass filter Q1, and a second resolving quadrupole mass filter Q2. The second quadrupole mass filter Q2 transmits fragment ions received from the collision cell 2 to an ion detection system 3. Representations of the ion current for the first transition 5 and the ion current for the second transition 6 are schematically shown at five evenly spaced time intervals t1, . . . , t5.

Between times t1 and t3, the ion detection system 3 monitors ions of the first MRM transition 5. The instrument is then reconfigured to monitor a second MRM transition, for example, by changing the resolving RF and DC voltages applied to the first quadrupole mass filter Q1 and/or to the second quadrupole mass filter Q2 so that the transition between a different precursor-fragment pair is monitored. After the instrument has been re-configured, at time t4, the first quadrupole mass filter Q1 is set to transmit ions corresponding to the second MRM transition 6. These ions are then fragmented in the collision cell 2 and the resulting fragment ions are eventually transmitted to the ion detection system 3 at a time t5.

Figure 2:
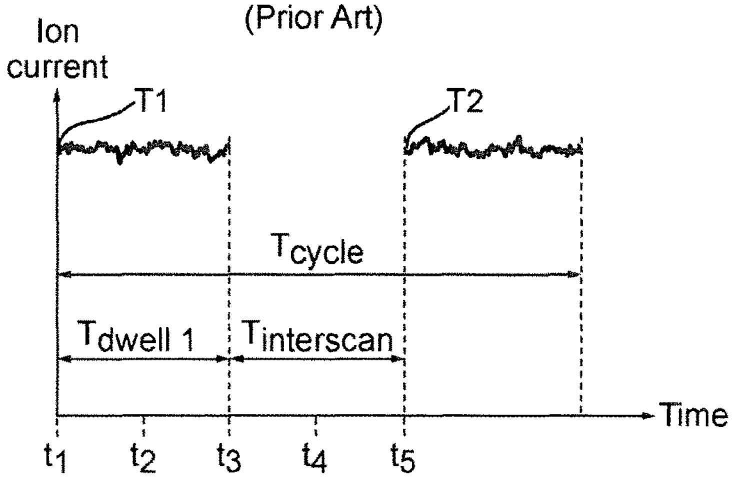
Fig. 2 (Prior Art)
FIG. 2 shows the measured ion current for the two transitions illustrated in FIG. 1.

FIG. 2 represents the measured ion current associated with monitoring the first and second transitions depicted in FIG. 1. It can be seen that the interscan time is t5–t3.

In a conventional MRM operation such as that depicted in FIGS. 1 and 2, the instrument is reconfigured for a second measurement only after a first measurement is made. The acquisition is, therefore, inherently of a serial nature and the interscan time is at least as long as the time corresponding to the transit time of ions through the device. The transit time for ions through different regions of the mass spectrometer will vary depending upon the pressure in the region and the forces applied to the ions. For example, it can take many milliseconds for an ion to traverse a collision cell if no driving force such as a travelling wave or an axial field is applied to speed or accelerate the ions through the device.

Applying a driving force such as a travelling wave or an axial field to the collision cell reduces the ion transit time and may also advantageously clear out any undesired fragment ions that are within the collision cell. By clearing out the collision cell in this way, fragments of the first transition are not transmitted during the measurement of the second transition (this effect being known as "cross-talk").

However, even when driven with a 300 m/s travelling wave it will typically take 0.6 ms for an ion to transit through a 180 mm collision cell. The time of flight through a quadrupole of length 130 mm for a 1 eV ion of mass to charge ratio 200 is 132 μs. Using these values for the arrangement depicted in FIG. 1, the total time of flight through the first quadrupole mass filter Q1, the collision cell 2 and the second quadrupole mass filter Q2 would be 864 μs. This leaves very little overhead in which to actually configure the instrument to transmit these ions when trying to achieve 1 ms or lower interscan times.

An embodiment will now be described.

Figure 3:
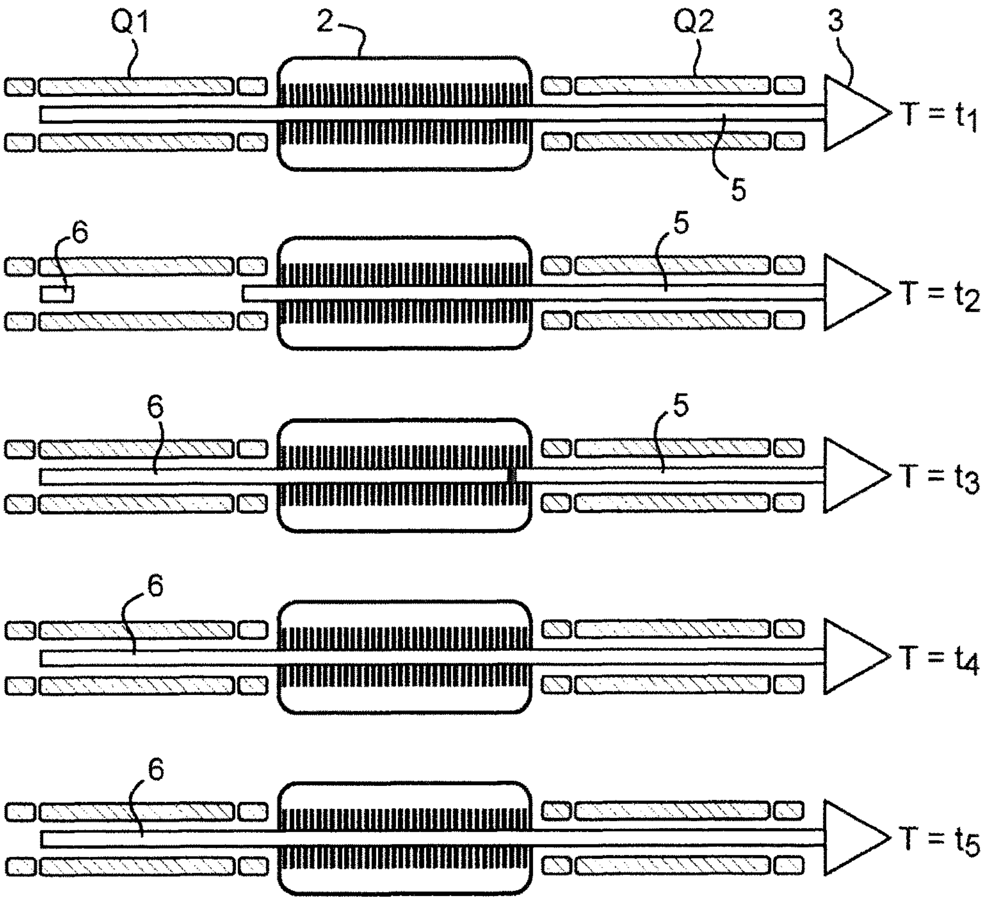
FIG. 3 depicts an interleaved MRM acquisition according to an embodiment.

FIG. 3 shows a similar tandem quadrupole mass spectrometer to that depicted in FIG. 1 but operated in accordance with an embodiment. Like reference numerals represent like components.

Figure 4:
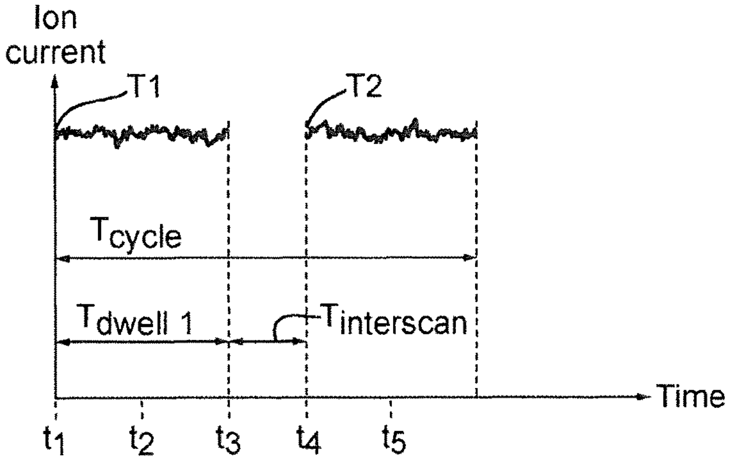
FIG. 4 represents the measured ion current for the two transitions shown in FIG. 3.

FIG. 4 represents the measured ion current corresponding to the embodiment shown in FIG. 3. Again, the ion current of the first MRM transition 5 is monitored for a first dwell time from t1 to t3. However, the first quadrupole Q1 is then reconfigured and set to transmit ions of second MRM transition 6 at an earlier time t2 i.e. before the end of the first dwell time (t3).

As parts of the mass spectrometer are reconfigured for the second MRM transition whilst the first MRM transition is still being measured, the acquisitions are now parallel or interleaved. It can be seen from FIG. 4 that the reduced interscan time is now t4–t3 (c.f. t5–t3). Thus, the interscan time and hence overall cycle time is reduced compared to the conventional arrangement described in relation to FIGS. 1 and 2.

In embodiments, one part of the mass spectrometer can monitor a first ion acquisition whilst another part of the mass spectrometer simultaneously transmits ions for the second acquisition. Such parallel or interleaved acquisition may be achieved by the fact that there is a known or calculable transit time through different regions of the mass spectrometer. As any given region or component of the mass spectrometer will contain a certain number of ions, ions will still exit the device for a period of time corresponding to the transit time through the device. The time at which the first quadrupole mass filter Q1 is set to start transmitting parent or precursor ions of the second MRM transition can be determined based on the ion transit times.

For instance, as described above, it may take 0.6 ms for ions to transit the collision cell 2. The collision cell 2 therefore contains approximately 0.6 ms of ion current and the first quadrupole Q1 can be set to transmit ions for the second MRM transition 0.6 ms prior to the end of the first dwell time without affecting the first MRM measurement. Similarly, the ions subsequently transmitted through the first quadrupole mass filter Q1 for the second MRM transition will not reach the ion detector 3 before the end of the first dwell time so the ions of the first transition will not interfere with this measurement so that cross-talk with the previous transition may be avoided. The first quadrupole mass filter Q1, and the rest of the instrument downstream of the first quadrupole mass filter Q1, has already been configured by the start of the interscan period, so can be transmitting parent or precursor ions of the next transition into the collision cell 2. This allows a reduction in the time required to clear and re-fill the collision cell 2 and consequently a reduction in the interscan time by up to 0.6 ms.

It will be readily apparent that since the current state of the art interscan time between monitoring MRM transitions is around 1.0 ms, a potential reduction of 0.6 ms represents a significant improvement.

The advantages described in relation to the above embodiments may apply equally to other experiments where other reconfigurations are performed between the ion acquisitions. For instance, an MRM experiment in which the second MRM transition is of a different polarity may be performed. In this situation there are typically several gas-filled regions which will be populated with ions of the existing transition. There will be at least one ion guide at the entrance to the instrument in addition to the collision cell. Before the end of the first MRM transition dwell time the polarity of the electrospray ion source is changed. Because it can take several milliseconds to swap the polarity of the ion source, it is possible that the various ion guides have sufficient stored ion current for several first MRM transitions to be measured before measuring the first transition of opposite polarity. In this case, the polarity of the ion source could be swapped several transitions prior to the first transition of opposite polarity.

The skilled person will recognise that the advantages discussed above are not confined to the specific quadrupole implementation shown in FIG. 3. Acquisitions can be temporally interleaved based on knowledge of the transit times through various regions or components of the mass spectrometer in a similar manner in any tandem or multi-stage mass spectrometer. For example, embodiments are contemplated comprising a quadrupole-Time of Flight mass spectrometer or an instrument containing an ion mobility separation stage.

Although the present invention has been described with reference to preferred embodiments, it will be understood by those skilled in the art that various changes in form and detail may be made without departing from the scope of the invention as set forth in the accompanying claims.

The invention claimed is:

1. A method of mass spectrometry comprising:

passing ions through a first stage and a second stage of a mass spectrometer;

monitoring a first ion acquisition for a first dwell time extending from a time $T_1$ to a time $T_1+T_{dwell1}$;

reconfiguring said mass spectrometer or one or more components of said mass spectrometer to monitor a second ion acquisition; and setting said first stage to transmit ions of the second ion acquisition at a time T, wherein $T<T_1+T_{dwell1}$; and monitoring the second ion acquisition for a second dwell time starting at a time $T_2$, wherein $T_2>T_1+T_{dwell1}$ so that there is a non-zero interscan time $T_2-T_1+T_{dwell1}$;

the method further comprising determining said time T based on a known or calculated ion transit time through one or more regions or components of said mass spectrometer disposed downstream of said first stage.

2. A method as claimed in claim 1, wherein said second stage comprises an ion detector or is arranged to transmit ions to an ion detector.

3. A method as claimed in claim 2, wherein said one or more regions or components of the mass spectrometer are disposed upstream of said second stage or said ion detector.

4. A method as claimed in claim 1, wherein said first stage and/or said second stage are selected from the group comprising: (i) a quadrupole mass filter or analyser; (ii) an ion mobility separation or differential ion mobility separation device; (iii) a Time of Flight mass analyser or other mass analyser; (iv) an ion trap; and (v) an ion guide or ion transfer device.

5. A method as claimed in claim 1, wherein said mass spectrometer further comprises a fragmentation or reaction device disposed between said first and second stages so that said first stage transmits parent or precursor ions and said second stage transmits fragment, daughter or product ions.

6. A method as claimed in claim 5, wherein said fragmentation or reaction device comprises a collision or reaction cell or device.

7. A method as claimed in claim 5, wherein said first stage comprises a first quadrupole mass filter or analyser and said second stage comprises a second quadrupole mass filter or analyser and wherein monitoring said first and second ion acquisitions comprises measuring first and second precursor-fragment or MRM transitions.

8. A method as claimed in claim 5, further comprising clearing said fragmentation or reaction device of ions between the first and second ion acquisitions.

9. A method as claimed in claim 8, further comprising clearing said fragmentation or reaction device is cleared using an AC or DC driving force, travelling wave or axial field.

10. A method as claimed in claim 1, wherein the step of reconfiguring the mass spectrometer or one or more components of the mass spectrometer comprises changing: (i) the mass to charge ratio of ions transmitted through a quadrupole mass filter or analyser; (ii) a collision energy or other fragmentation or reaction parameter; (iii) the polarity of the instrument; (iv) a RF voltage applied to an ion guide; (v) a DC axial field or voltage applied to a component of the mass spectrometer; or (vi) a de-clustering or cone voltage.

11. A method as claimed in claim 1, wherein an interscan time is less than 0.2 ms, 0.3 ms, 0.4 ms, 0.5 ms, 0.6 ms, 0.8 ms, 1 ms, 2 ms, 3 ms, 4 ms, 5 ms, 10 ms or 20 ms.

12. A method as claimed in claim 1, wherein said ions are passed through said first stage and/or are passed through said one or more components or regions and/or are passed to said second stage as a substantially continuous, pseudo-continuous or extended stream.

13. A mass spectrometer comprising:

a first stage;

a second stage; and a control system arranged and adapted:

(i) to monitor a first ion acquisition for a first dwell time extending from a time T1 to a time $T1+T_{dwell}$;

(ii) to reconfigure said mass spectrometer or one or more components of said mass spectrometer to monitor a second ion acquisition;

(iii) to set said first stage to transmit ions of the second ion acquisition at a time T, wherein $T<T1+T_{dwell}$ so that there is a non-zero interscan time;

(iv) to monitor a second ion acquisition for a second dwell time starting at a time $T_2$, wherein $T_2>T1+T_{dwell}$; and wherein the non-zero interscan time equals $T2-T1+T_{dwell}$.

14. A method as claimed in claim 1 comprising:

passing a beam of ions through a tandem mass spectrometer comprising a collision cell, a first quadrupole mass filter or analyser disposed upstream of said collision cell arranged to transmit parent or precursor ions, and a second quadrupole mass filter or analyser disposed downstream of said collision cell arranged to transmit fragment or product ions;

monitoring a first precursor-fragment transition for said first dwell time extending from said time $T_1$ to said time $T_1+T_{dwell1}$;

setting said first quadrupole mass analyser to transmit parent or precursor ions of the second transition at said time T, wherein $T<T_1+T_{dwell1}$; and monitoring a second precursor-fragment transition for said second dwell time starting at said time $T_2$, wherein $T_2>T_1+T_{dwell1}$;

the method further comprising determining said time T based on a known or calculated ion transit time through said collision cell and/or through an ion guide disposed upstream of said second quadrupole mass filter or analyser.

15. A method as claimed in claim 14, further comprising transmitting fragment or product ions from said second quadrupole mass analyser to an ion detector.

16. A method as claimed in claim 14, wherein an interscan time is less than 0.2 ms, 0.3 ms, 0.4 ms, 0.5 ms, 0.6 ms, 0.8 ms, 1 ms, 2 ms, 3 ms, 4 ms, 5 ms, 10 ms or 20 ms.

17. A mass spectrometer as claimed in claim 13 comprising:

a first quadrupole mass filter or analyser;

a second quadrupole mass filter or analyser;

a collision cell disposed between said first and second quadrupole mass filters or analysers; and wherein said control system is arranged and adapted:

(i) to monitor a first precursor-fragment transition for said first dwell time extending from said time $T_1$ to said time $T_1+T_{dwell1}$;

(ii) to set said first quadrupole mass filter or analyser to transmit parent or precursor ions of the second transition at said time T, wherein $T<T_1+T_{dwell1}$; and (iii) to monitor a second precursor-fragment transition for said second dwell time starting at said time $T_2$, wherein $T_2>T_1+T_{dwell1}$;

wherein said time T is based on a known or calculated ion transit time through said collision cell and/or through an ion guide disposed upstream of said second quadrupole mass filter or analyser.

18. A method of mass spectrometry comprising:

passing ions through a first stage and a second stage of a mass spectrometer;

monitoring a first ion acquisition for a first dwell time extending from a time $T_1$ to a time $T_1+T_{dwell1}$;

reconfiguring said mass spectrometer or one or more components of said mass spectrometer to monitor a second ion acquisition; and setting said first stage to transmit ions of the second ion acquisition at a time T, wherein $T<T_1+T_{dwell1}$ so that there is a non-zero interscan time $T_2-T_1+T_{dwell1}$; and monitoring the second ion acquisition for a second dwell time starting at a time $T_2$, wherein $T_2>T_1+T_{dwell1}$.

19. A mass spectrometer as claimed in claim 13, wherein the time T is determined based on a known or calculated ion transit time through one or more regions or components of said mass spectrometer disposed downstream of said first stage.

* * * * *